United States Patent [19]
Yokoyama

[11] 4,371,840
[45] Feb. 1, 1983

[54] GAIN CONTROL CIRCUIT FOR PULSE WIDTH MODULATION AMPLIFIER

[75] Inventor: Kenji Yokoyama, Hamamatsu, Japan

[73] Assignee: Nippon Gakki Seizo Kabushiki Kaisha, Japan

[21] Appl. No.: 168,726

[22] Filed: Jul. 14, 1980

[30] Foreign Application Priority Data

Aug. 8, 1979 [JP] Japan .................. 54-109327

[51] Int. Cl.³ .............................. H03F 3/38
[52] U.S. Cl. ...................... 330/10; 330/285
[58] Field of Search ............ 330/10, 207 A, 251, 330/278, 279, 285; 455/174, 194, 218, 220; 375/104

[56] References Cited
U.S. PATENT DOCUMENTS 2,379,484 7/1945 Haynes ..................... 330/10
3,551,851 12/1970 Engel ..................... 330/10 X

*Primary Examiner*—James B. Mullins
*Attorney, Agent, or Firm*—Kane, Dalsimer, Kane, Sullivan and Kurucz

[57] ABSTRACT

An improved gain control circuit for a pulse width modulation amplifier (PWM amplifier) which comprises: a pulse width modulation circuit which modulates a carrier signal by an input signal to the PWM amplifier to make a pulse width modulated signal; a pulse amplification circuit for amplifying the pulse width modulated signal to generate an amplified pulse width modulated signal; and a low-pass filter circuit for extracting therefrom an output signal having the same waveform as the input signal, comprising variable voltage supplying means capable of supplying a variable voltage to the pulse amplification circuit whereby the gain of the PWM amplifier is controlled in accordance with the supply voltage applied to the pulse amplification circuit. Tha gain control circuit may preferably be used in a volume control circuit as well as a muting circuit in an audio signal amplifier.

8 Claims, 5 Drawing Figures

GAIN CONTROL CIRCUIT FOR PULSE WIDTH MODULATION AMPLIFIER

BACKGROUND OF THE INVENTION

1. Field of the Invention

This invention relates to a gain control circuit for a pulse width modulation amplifier and, more particularly, to an improved gain control circuit which controls a gain by varying a supply voltage to a pulse amplification circuit of the pulse width modulation amplifier in accordance with a control signal without varying a level of an input signal to be amplified.

2. Description of the Prior Art

In an amplifier employing a pulse width modulation circuit and adapted for use in such as an audio signal amplifier, it is known in the art to control a gain of the amplifier in such a way as a level of an input signal applied to the amplifier is adjusted to a certain level so as to obtain a desired output level at the output of the amplifier. That is, the adjustment of the input signal level is accomplished by controlling a variable resistor or the like which is provided to an input side of the amplifier and devides the input signal level.

A typical arrangement, in the art, of an amplifier with a pulse width modulation circuit (hereinafter called as PWM amplifier) as shown in FIG. 1 comprises: a pulse width modulation circuit 1 for modulating a carrier signal by an input signal as a modulating signal, i.e., an audio input signal to be amplified in the PWM amplifier in the case of audio signal amplification thereby producing a pulse width modulated signal; a pulse amplification circuit 2 for amplifying the pulse width modulated signal; and a lowpass filter circuit 3 through which the amplified pulse width modulated signal delivered from the pulse amplification circuit 2 is passed to generate an output signal having the same waveform as the original modulating signal. More specifically, the pulse width modulation circuit 1 which is comprised of a comparator circuit receives at a non-inverting input terminal 4 a carrier signal having generally a sawtooth waveform as shown in FIG. 1, and at an inverting input terminal 5 the input signal. The pulse width modulation circuit 1 then produces the pulse width modulated signal by comparing the input signal to the carrier signal. The pulse width modulated signal thus outputted from the pulse width modulation circuit 1 is applied to the pulse amplification circuit 2 which comprises a driver stage circuit 6 followed by a switching circuit 7. The switching circuit 7 is formed with a pnp transistor 8 and an npn transistor 9 each having a diode coupled between the collector and the emitter of the transistors 8 and 9, respectively. The collectors of these transistors 8 and 9 are connected together to a junction point 10 to which the input terminal of the low-pass filter circuit 3 is connected. The output terminal of the filter circuit 3 is connected to an output terminal 16 of the PWM amplifier to which a load 11 is connected.

Thus, the input signal applied to the inverting input terminal 5 of the pulse width modulation circuit 1 is compared to the carrier signal to generate the pulse width modulated signal which is fed to the driver stage circuit 6 in order to drive the switching circuit 7. The output of the driver stage circuit 6 is pulse-amplified by the transistors 8 and 9 of the switching circuit 7 so that the amplified pulse modulated signal is provided to the input of the low-pass filter 3. In this case it should be noted that the switching circuit 7 is set to be operable in ON-OFF mode in association with the output level of the driver stage circuit 6 with the result that the amplified pulse modulated signal has such an amplitude as is substantially equal to, but is slightly lower than power supply voltages supplied at power supply terminals 14 and 15, respectively, because of a collector-emitter saturation voltage. Finally, in the low-pass filter 3, the low frequency components of the amplified pulse modulated signal is extracted therefrom to develope across the load 11 the output signal, i.e., an amplified audio signal having the same waveform as the input signal.

In the PWM amplifier thus constructed, a conventional method for controlling the gain of the PWM amplifier is accomplished by providing adjusting means such as a variable resistor 12 provided in such a manner that an input signal to the PWM amplifier is applied to the inverting input terminal 5 of the pulse width modulation circuit 1 through the variable resistor 12. The variable resistor 12 has a slider terminal and two stationary terminals, the former being connected to the inverting terminal 5 of the pulse width modulation circuit 1, and the latter being connected to an input supply terminal 13 and ground, respectively. Hence, the input signal supplied to the termnal 13 is divided by the variable resistor 12 and delivered to the inverting input terminal 5 of the circuit 1 so as to be compared to the carrier signal. The output of the circuit 1 is pulse-width-modulated in accordance with the level of the input signal at the inverting input terminal 5, the output signal of the filter 3 is varied as desired by changing a position of the slider contact of the variable resistor 12.

The use of such a variable resistor, however, gives rise to some problems because it is often necessary to locate the variable resistor remotely from an input terminal of the associated PWM amplifier in order to manipulate it outside a casing of an audio amplifier. This results in the need for an appreciable lengthy lead wires which couple the variable resistor to the input terminal of the PWM amplifier, so that the wires are liable to receive noise interference and the location of the variable resistor is limited to a restricted place so as not to receive noise interference. Moreover, the power supply voltages applied to the switching circuit is substantially maintained constant during its operation regardless of the level of both the input signal to be amplified and the carrier signal. Therefore, there is another problem that even in the case of low signal amplification spurious radiation from the switching circuit is kept almost equal to that in the case of high signal amplification, and that carrier leakage is further developed by raising the power supply voltages in order to produce a high output voltage across the load.

SUMMARY OF THE INVENTION

It is, therefore, a principal object of the present invention to provide an improved gain control circuit for a PWM amplifier.

It is a further object of the invention to provide a gain control circuit which requires no lengthy lead wires as conventional one so that it is not susceptible to noise interference.

It is a still further object of the invention to provide a gain control circuit which is capable of substantially reducing spurious radiation and carrier leakage when a PWM amplifier is operated under a low output level.

Briefly, a gain control circuit according to the invention is constructed in such a way as it can attain an easy gain control by changing a voltage level of power sources applied to the pulse amplification circuit of a PWM amplifier.

According to a broad aspect of the invention there is provided a gain control circuit for a PWM amplifier comprising a pulse width modulation circuit which modulates a carrier signal by an input signal to make a pulse width modulated signal, a pulse amplification circuit for amplification of the pulse width modulated signal, and a low-pass filter adapted to obtain an output signal having the same waveform as the original input signal, and further comprising variable voltage supply means capable of supplying a variable voltage to the pulse amplification circuit whereby the gain of the PWM amplifier is controlled in accordance with the level of the supply voltage supplied by the variable voltage supply means.

The foregoing and other objects, features and advantages of the invention will be apparent from the following, more detailed, description of a preferred embodiment taken in conjunction with the accompanying drawings, in which:

DETAILED DESCRIPTION

Figure 1:
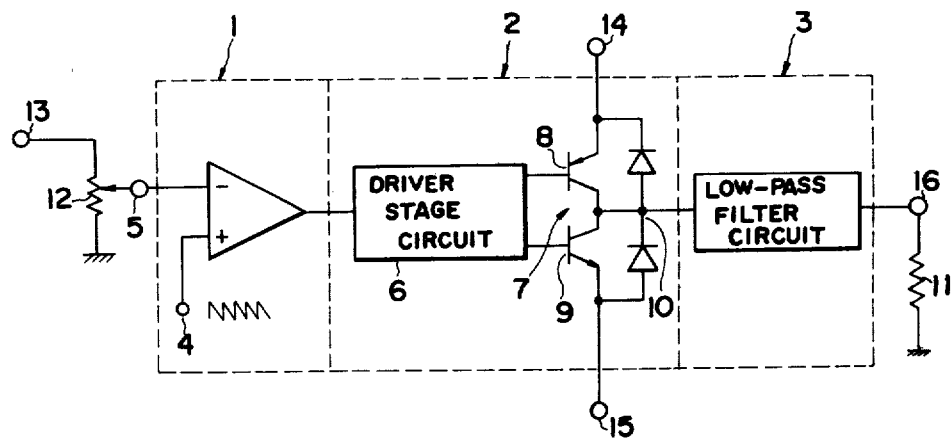
FIG. 1 is a schematic diagram of a PWM amplifier with a gain control circuit according to the prior art.
Figure 2:
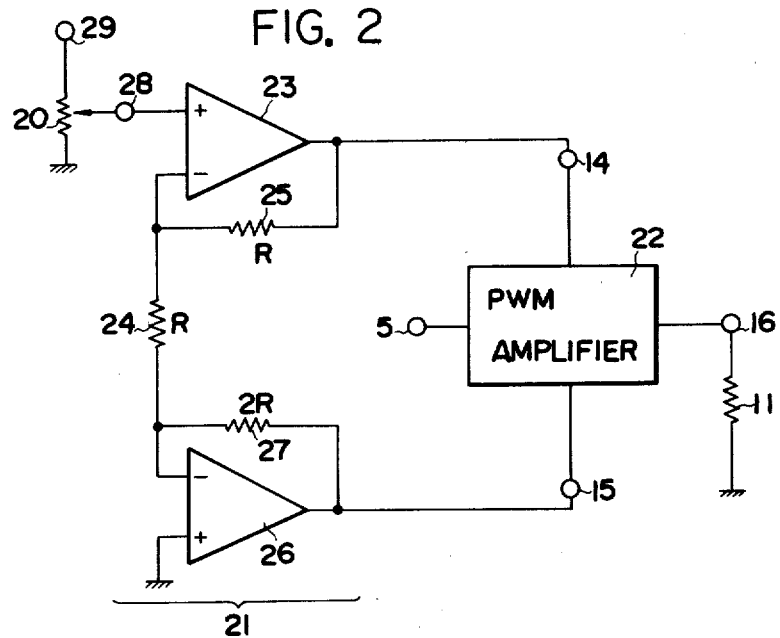
FIG. 2 is a schematic diagram of a first embodiment of a gain control circuit for a PWM amplifier according to the present invention.

Referring to FIG. 2, there is shown a schematic diagram of an example of a gain control circuit adapted for use in a volume control circuit of an audio equipment. In this FIG. 2 a PWM amplifier 22 is comprised of the same configuration as described in FIG. 1. The gain control circuit shown in the drawing is comprised of a variable resistor 20 and a power supply circuit 21 so that the voltage level of output signals to be dervied from the PWM amplifier 22 may be controlled by supply voltages to the PWM amplifier 22 which are varied in accordance with a control signal from the variable resistor 20. More in detail, the variable resistor 20 having two stationary terminals and a slider terminal is employed to provide the control signal to the input terminal 28 of the power supply circuit 21. One stationary terminal of the variable resistor 20 is connected to a positive power source terminal 29 and the other terminal is connected to ground, while the remaining slider terminal is connected to a non-inverting input terminal of an operational amplifier 23 through the input terminal 28, so that the control signal delivered from the variable resistor 20 is applied to the operational amplifier 23. An inverting input terminal of the amplifier 23 is connected to one terminal of a resistor 24 having a resistance value R, and a resistor 25 having a resistance value R is coupled across the inverting input terminal and the output terminal respectively of the operational amplifier 23. The other terminal of the resistor 24 is connected to an inverting input terminal of an operational amplifier 26 whose non-inverting terminal is connected to ground. A resistor 27 having a resistance value 2R is coupled across the inverting input terminal and the output terminal of the operational amplifier 26. The output of the operational amplifiers 23 and 26, i.e., the output of the power supply circuit 21 is fed to a pulse amplification circuit 2 of the PWM amplifier 22. It should be understood, therefore, that like parts particularly with reference to terminals such as 5, 14, 15 and 16 are indicated by like reference numerals in FIGS. 1 and 2. The PWM amplifier 22 receives an input audio signal at the terminal 5 and developes an output signal across the load 11 which is connected between the output terminal 16 of the PWM amplifier 22 and ground.

In operation, when the control signal applied to the input terminal 28 of the power supply circuit 21 has a voltage value of Vi, the output voltages delivered to the output terminals of the operational amplifiers 23 and 26 respectively show the values of $+2$ Vi and $-2$ Vi, which is clearly understood by applying conventional operational amplifier circuit analysis.

Figure 3:
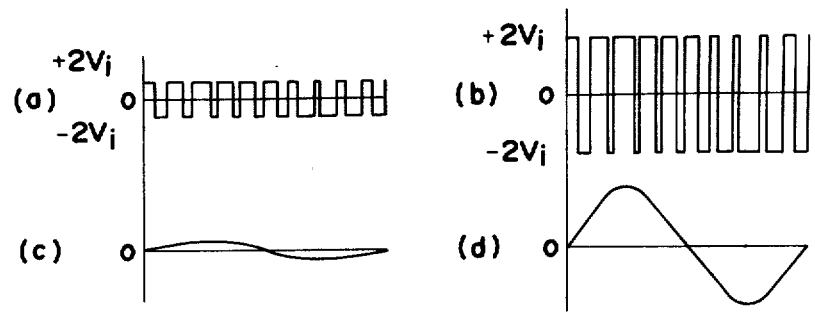
FIG. 3 graphically illustrates a relationship between pulse width modulated signals and audio output signals having respectively a different voltage level.

As a result, a switching circuit 7 in the PWM amplifier 22 is supplied at the respective power supply terminals 14 and 15 with the positive potential voltage $+2$Vi and the negative potential voltage $-2$ Vi, so that the input signal applied to the input terminal 5 and subsequently pulse-width modulated and delivered to the switching circuit 7 is pulse-amplified to have a voltage level slightly lower in magnitude than the supply voltages $+2$ Vi and $-2$ Vi, respectively, because of collector-emitter saturation voltage of transistors 8 and 9. Thus, when the control signal is set at a lower value by adjusting the position of the slider contact of the variable resistor 20, the supply voltages $+2$ Vi and $-2$ Vi are accordingly lowered in magnitude so that the level of an amplified pulse width modulated signal at an output terminal 10 is lowered in accordance with the level of the control signal. On the contrary to the above, when the control signal is set at a higher value in the similar manner the supply voltage $+2$ Vi increases accordingly thereby causing the amplified pulse modulated signal to have the corresponding higher magnitude of voltage. The pulse width modulated signals thus amplified and having either a lower or a higher voltage level, respectively illustrated as in FIGS. 3 (a) and (b) are then supplied to a low-pass filter 3 with the result that the amplified pulse modulated signal is demodulated to produce an audio output signal representative of the original audio input signal having either a lower or a higher voltage level in accordance with the level of the control signal. In this case the output signals (c) and (d) respectively corresponding to the lower and higher pulse width modulated signals (a) and (b) have the same waveform as the original input one and also have the same frequency and phase because according to the invention the pulse width modulated signals (a) and (b) are modulated equally with respect to the respective pulse width by the pulse width modulation circuit 1.

Thus, the output level of the audio signal developed across the load 11 is changed by controlling the control signal. This means that the gain control of the PWM amplifier 22 can be made by adjusting the position of the slider contact of the variable resistor 20.

Further, it should also be noted that by employing the gain control circuit according to the invention it is possible to obtain a gain control range about 30 dB due to the fact that the voltage level of the pulse width modulated signals delivered to the junction point 10 is determined by both the minimum operating voltages of the transistors 8 and 9 under active region and the maximum breakdown voltages of the transistors 8 and 9, those voltage values generally reaches at the value of from about +1 V and −1 V to about +50 V and −50 V, respectively.

Figure 4:
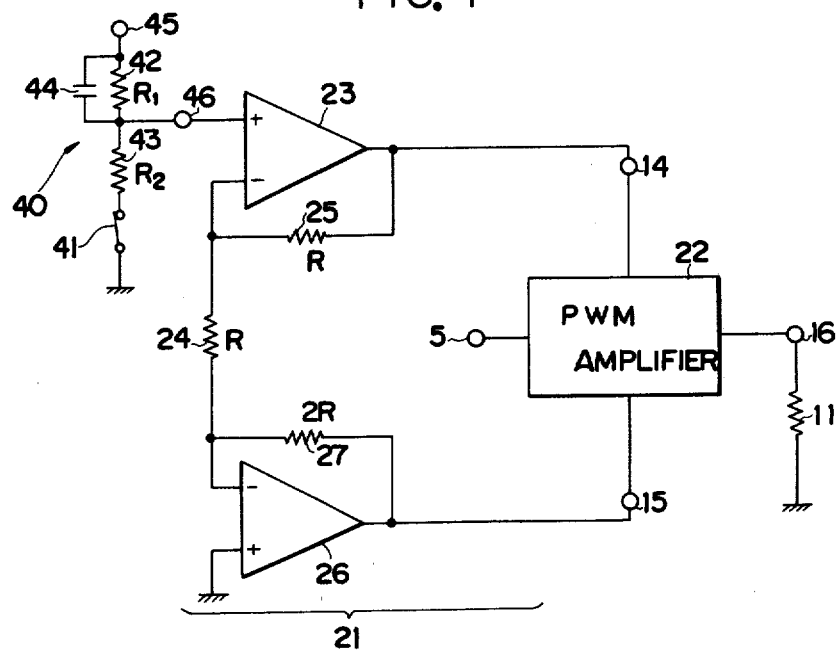
FIG. 4 is a schematic diagram of a second embodiment of a gain control circuit for a PWM amplifier according to the present invention.

FIG. 4 is a schematic diagram of another embodiment according to the invention which is adapted for use in a muting circuit in an audio signal amplifier. The greater part of the circuit is identical to that of FIG. 2; thus, like elements are denoted by like numerals. Specifically, a gain control circuit as shown in FIG. 4 comprises a control signal supply circuit 40 and a power supply circuit 21 which is controlled by a control signal generated from the control signal supply circuit 40 thereby supplying power supply terminals 14 and 15 with the desired supply voltages so as to control the gain of the PWM amplifier 22. The control signal supplying circuit 40 is comprised of a switch 41 and a voltage devider composed of resistors 42 and 43 each connected in series and having a resistance value R1 and R2, respectively. The resistor 42 is shunted by a capacitor 44 across its both ends, and one end thereof is connected to a positive power source terminal 45 while the other end is connected to the one end of the resistor 43, the other end of which is grounded through the switch 41. The junction point between the resistors 42 and 43 is connected to a non-inverting input terminal of an operational amplifier 23 through the input terminal 46 of the power supply circuit 21.

In operation, when the switch 41 is turned ON which corresponds to a muting condition and a voltage Vc is supplied to the power source terminal 45, the voltage R2/R1+R2 ·Vc is accordingly applied to the input terminal 46 of the power supply circuit 21. On the other hand, when the switch 41 is turned OFF which corresponds to a muting free condition, the voltage Vc is directly applied to the input terminal 46 of the power supply circuit 21. Accordingly, as is clear from and similar to the description with respect to the first embodiment, at the time of the muting condition, the voltage level of the output signal developed across the load 11 is reduced R2/R1+R2 times as large as that when the amplifier is under muting free condition.

Figure 5:
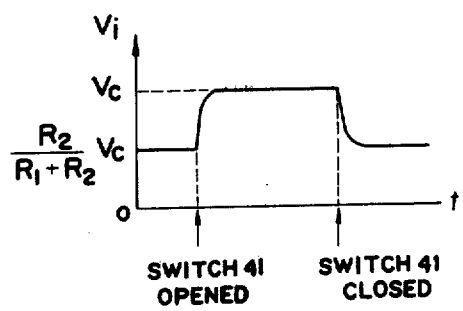
FIG. 5 illustrates a waveform of a control signal for variable voltage supplying means of a PWM amplifier adapted for use in a muting circuit.

Turning to FIG. 5 in which one example of the voltage waveform changed in correspondence with the ON-OFF operation of the switch 41 is illustrated. The leading edge and trailing edge portion of the voltage waveform is formed exponentially in accordance with the time constant resulting from the capacitor 44 so that the gain control of the PWM amplifier 22 can be smoothly performed without developing any transient noises at the time instant of switching operation of the switch 41.

From the foregoing description, it should be appreciated that, since the gain control circuit according to the present invention is made such that the gain of the PWM amplifier is controlled by adjusting the supply voltage to the pulse amplification circuit, it is less susceptible to noise interference when compared to the conventional gain control circuit where a variable resistor is required at the input circuit portion of the PWM amplifier. Moreover, as the supply voltage to the pulse amplification circuit may be operable at a low level when the relatively small output signal is used in the PWM amplifier, a spurious radiation or a carrier leakage is reduced remarkably.

Thus, the circuitry has practical applications and is particularly adapted for use in a volume control circuit as well as a muting circuit in an audio signal amplifier. One obvious modification of the circuitry described above can include the provision of a single power supply system instead of the above described two power supply system, i.e., a positive and negative voltage supply system.

While there have been shown and described some preferred embodiments of the present invention, it is to be understood that the present invention is not limited thereto but may be variously modified and practiced within the scope set forth in the attached claims.

What is claimed is:

1. In a gain control circuit for a pulse width modulation amplifier comprising a pulse width modulation circuit which modulates a carrier signal by an input signal applied to said pulse width modulation amplifier to make a pulse width modulated signal, a pulse amplification circuit for amplifying said pulse width modulated signal to generate an amplified pulse width modulated signal, said pulse amplification circuit having two power supply terminals and said amplified pulse width modulated signal having an amplitude of a same value as a value of the voltage supplied to said two power supply terminals, and a low-pass filter circuit adapted for use in obtaining an output signal having the same waveform as said input signal from said amplified pulse width modulated signal, said gain control circuit comprising, variable voltage supplying means capable of supplying a variable voltage to said two power supply terminals of said pulse amplification circuit, said amplitude of said amplified pulse width modulated signal being varied by varying the voltage supplied to said two power supply terminals of said pulse amplification circuit, so that an amplitude of said output signal derived from said low-pass filter circuit being varied, whereby the gain of the pulse width modulation amplifier is controlled in accordance with the supply voltage applied to the pulse amplification circuit.

2. A gain control circuit according to claim 1, wherein said variable voltage supplying means comprises:

power supply circuit means which supplies a supply voltage to said pulse amplification circuit; and
control signal supply circuit means for providing a control signal to said power supply circuit means so as to generate said supply voltage in accordance with said control signal.

3. A gain control circuit according to claim 2, wherein said power supply circuit means comprises:

first amplifying means having an output and inverting and non-inverting inputs for generating said supply voltage having a positive potential;
second amplifying means having an output and inverting and non-inverting inputs for generating said supply voltage having a negative potential;
first resistor means coupled across said inverting input and said output of the first amplifying means;
second resistor means coupled across said inverting input and said output of the second amplifying means; and
third resistor means connected between said inverting inputs of the first amplifying means and the second amplifying means, said non-inverting input of the first amplifying means being connected to an output of said control signal supply circuit means and said non-inverting input of the second amplifying means being connected to ground.

4. A gain control circuit according to claim 3, wherein said first and second amplifying means are operational amplifiers.

5. A gain control circuit according to claim 3, wherein said first and second resistor means have substantially equal resistances and said third resistor means has a double resistance value as large as said first or second resistance value.

6. A gain control circuit according to claim 2, wherein said control signal supply circuit means comprises;
a variable resistor having a slider terminal and two stationary terminals, said slider terminal being connected to the input of said power supply circuit means and one of the stationary terminal being connected to a power source terminal while the other stationary terminal being grounded.

7. A gain control circuit according to claim 2, wherein said control signal supply circuit means comprises:
fourth and fifth resistor means connected in serial relation with each other, the junction point of said fourth and fifth resistor means being connected to the input of said power supply circuit means, the fourth resistor means being connected to a power source terminal; and
switch means connected at one terminal at said fifth resistor means and to ground at the other terminal, thereby enabling said control signal supply circuit means to supply two different levels of control signals to said power supply circuit means.

8. A gain control circuit according to claim 7, wherein said control signal supply circuit means further comprises:
a capacitor means coupled across said fourth resistor means.

* * * * *